(12) United States Patent
Miao et al.

(10) Patent No.: US 7,118,292 B2
(45) Date of Patent: Oct. 10, 2006

(54) COAXIAL COOLED LASER MODULES WITH INTEGRATED THERMAL ELECTRIC COOLER AND OPTICAL COMPONENTS

(75) Inventors: Rongsheng Miao, El Monte, CA (US); Leo Kha, Diamond Bar, CA (US); Matthew Swass, Tujunga, CA (US)

(73) Assignee: Emcore Corporation, Somerset, NJ (US)

( * ) Notice: Subject to any disclaimer, the term of this patent is extended or adjusted under 35 U.S.C. 154(b) by 0 days.

(21) Appl. No.: 11/040,915

(22) Filed: Jan. 24, 2005

(65) Prior Publication Data
US 2006/0165353 A1    Jul. 27, 2006

(51) Int. Cl.
*G02B 6/42* (2006.01)
(52) U.S. Cl. .............................. 385/88; 385/93; 385/94
(58) Field of Classification Search ............ 385/88–94; 257/712–722
See application file for complete search history.

(56) References Cited

U.S. PATENT DOCUMENTS

| | | | |
|---|---|---|---|
| 5,924,290 A * | 7/1999 | Yoshino | 62/3.7 |
| 2005/0025420 A1* | 2/2005 | Farr | 385/33 |
| 2005/0047731 A1* | 3/2005 | Hu et al. | 385/92 |
| 2005/0100290 A1* | 5/2005 | Huang | 385/92 |

* cited by examiner

*Primary Examiner*—Sarah Song

(57) ABSTRACT

An opto-electric module adapted to be coupled with an optical fiber on a first side and a plurality of electrical conductors on a second side. The opto-electric module includes a header with a plurality of pins extending through the header a thermo-electric cooler with a hot plate of the thermo-electric cooler disposed against a second, opposing side of the header and a plurality of active and passive optical components adapted to convert between an optical signal format within the optical fiber and an electrical signal format within at least one conductor of the plurality of conductors, said plurality of active and passive optical components all being in thermal contact with a cold plate of the thermo-electric cooler.

19 Claims, 4 Drawing Sheets

INDIVIDUAL VIEW OF TO HEADER SUBASSEMBLY AND SEALING CAP

COMPLETED LASER MODULE

INDIVIDUAL VIEW OF TO HEADER
SUBASSEMBLY AND SEALING CAP

INDIVIDUAL VIEW OF TO HEADER
SUBASSEMBLY AND SEALING CAP

TO HEADER WITH INLINE PIN CONFIGURATION

TO HEADER WITH CIRCULAR PIN CONFIGURATION

COMPACT LD-MPD PLACEMENT

LENS-ISOLATOR COMBO

LENS-ISOLATOR COMBO

CARRIER MODULE

CARRIER MODULE

COAXIAL COOLED LASER MODULES WITH INTEGRATED THERMAL ELECTRIC COOLER AND OPTICAL COMPONENTS

FIELD OF THE INVENTION

The invention relates to electro-optical converters, and more particularly to integrated laser assemblies or modules that provide a communications interface between a computer or communications unit having an electrical connector or interface and an optical fiber, such as used in fiber optic communications links.

BACKGROUND OF THE INVENTION

This application is related to copending U.S. patent application Ser. No. 11/059,790 filed on Feb. 16, 2005 (pending), assigned to the common assignee.

A variety of electro-optic transceivers are known in the art. Such devices typically include an optical laser module that converts an electrical signal into a modulated light beam that is coupled to an optical fiber, and a receiver that receives an optical signal from an optical fiber and converts it into an electrical signal. Traditionally, the optical laser module includes a laser diode (LD) and other optic components and it focus or directs the light from the laser diode onto the optic fiber, which in turn, is connected to network transmission line. The laser module is typically packaged in a hermetically sealed package in order to protect the laser diode from harsh environmental conditions.

The laser diode is provided as semiconductor chip that is typically a few hundred microns wide and 100–500 microns thick. The package in which they are sealed is typically in the butterfly or coaxial form factors with several electrical leads coming out of the package. These electrical leads are typically soldered to the circuit board containing the amplifier/limiter.

The coaxial laser modules have seen some use in fiber optic telecommunication and CATV applications. Such modules typically use transistor outline (TO) packages and provide a relatively low cost solution in some markets. However, for applications where the laser consumes a relatively large amount of power or the laser is operated over a wide range of ambient temperatures, the laser diode and other optical components must be cooled in order to meet the requirements of an extremely narrow frequency spectrum and stable LD performance. External, forced air cooling has been the method of choice.

The use of internal cooling with TO packages has proven difficult due to the limited space within the TO header and the size of the active and passive components found therein. One previous effort in this regard involved the cooling of a converter module using very small custom thermo-electric coolers (TECs) and was limited to the cooling of only the active components (i.e., the LD) and not the passive components (i.e., lens and isolator). The cooling of only the active components has been found to result in unstable optical performance where a wide range of operating temperatures are involved.

In order to address these deficiencies in prior designs, a new style of coaxial cooled laser module based on an optimized thermal and mechanical design is described below under illustrated embodiments of the invention. This proposed cooled laser module uses a commercially available miniaturized TEC and integrates both the active and the passive optical components on a temperature controllable platform to provide a stable laser and optical performance.

SUMMARY OF THE INVENTION

It is an object of the present invention to provide an improved optical laser module using an integrated thermal electric cooler and other optical subassemblies.

It is another object of the present invention to provide an optical laser module subassembly for use with different optical transmission systems.

It is also another object of the present invention to provide a cooled optical laser module for use in an optical transmission system with a housing that meets industry standards.

It is also another object of the present invention to provide a cooled optical transceiver for use in an optical wavelength division multiplexed (WDM) transmission system.

It is still another object of the present invention to provide improved heat dissipation in an optical transceiver by using a TEC subassembly inside the housing.

It is another object of the present invention to provide a cooled optical transceiver for use in an optical transmission system with key optical components packaged in a hermetically sealed enclosure to protect them from exposure to environmental conditions.

It is another object of the present invention to provide a cooled optical laser module that is easily manufactured by using simplified optical component mounting and alignment techniques.

These and other objects are provided by an opto-electric module adapted to be coupled with an optical fiber on a first side and a plurality of electrical conductors on a second side. The opto-electric module includes a header with a plurality of pins extending through the header, each pin of the plurality of pins extending through the header and each pin of the plurality of pins being adapted to engage a respective conductor of the plurality of conductors on a first side of the header, a thermo-electric cooler with a hot plate of the thermo-electric cooler disposed against a second, opposing side of the header and a plurality of active and passive optical components adapted to convert between an optical signal format within the optical fiber and an electrical signal format within at least one conductor of the plurality of conductors, said plurality of active and passive optical components all being in thermal contact with a cold plate of the thermo-electric cooler.

Briefly, and in alternate and general terms, the present invention provides an optical laser module for converting an information-containing electrical signal into an optical signal and coupling the converted optical signal into an optical fiber. The optical laser module includes a housing including an electrical connector for coupling with an external mount, such as a receptacle on a printed circuit board and also a transparent window adapted for coupling an optical signal with an external optical fiber subassembly in the housing.

Additional objects, advantages, and novel features of the present invention will become apparent to those skilled in the art from this disclosure, including the following detailed description as well as by practice of the invention. While the invention is described below with reference to preferred embodiments, it should be understood that the invention is not limited thereto. Those of ordinary skill in the art having access to the teachings herein will recognize additional applications, modifications and embodiments in other fields, which are within the scope of the invention as disclosed and claimed herein and with respect to which the invention could be of utility.

BRIEF DESCRIPTION OF THE DRAWINGS

These and other features of this invention will be better understood and more fully appreciated by reference to the following detailed description when considered in conjunction with the accompanying drawings, wherein.

Figure 1:
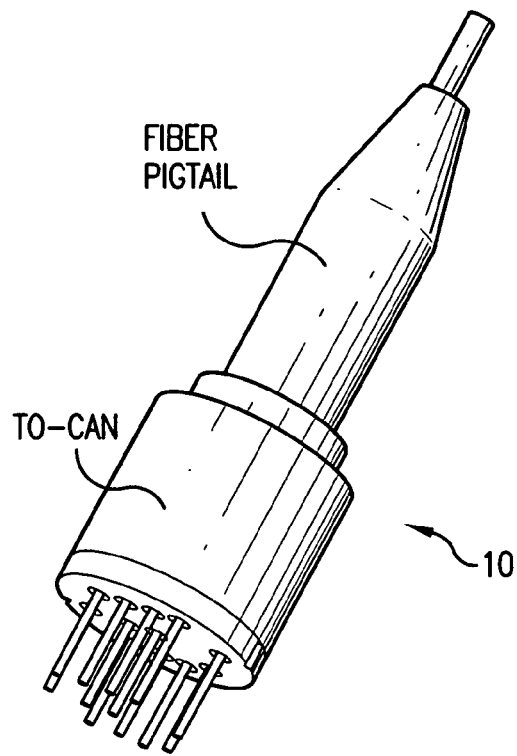
FIG. 1 is a perspective view of the proposed coaxial cooled laser module.

It should be noted that the dimensions and scales shown in above figures are not accurate and are for illustration and explanation only. Similarly, the components shown in the figures also are for illustration and explanation purpose. Actual components may vary. For simplicity, the wirebonds between the components are omitted herein.

DETAILED DESCRIPTION OF THE PREFERRED EMBODIMENT

Details of present invention will now be described, including exemplary aspects and embodiments thereof. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of actual embodiments or the relative dimensions of the depicted elements, and are not drawn to scale.

With this in mind, FIG. 1 shows a coaxially cooled laser module 10 under illustrated embodiments of the invention. The coaxial cooled laser module 10 shown in FIG. 1 consists of a TO-can and a fiber pigtail module 12 which functions to align an axis of light transmission between the TO-can and the optical fiber.

Figure 2A:
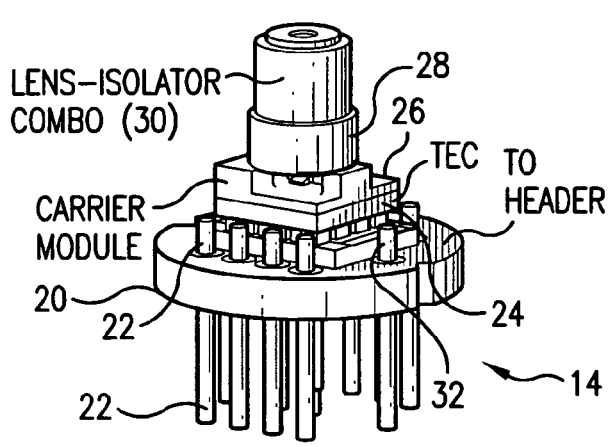
FIG. 2 (a) and (b) are typical views of the TO-can package and the cap of FIG. 1 with a flat window.
Figure 2B:
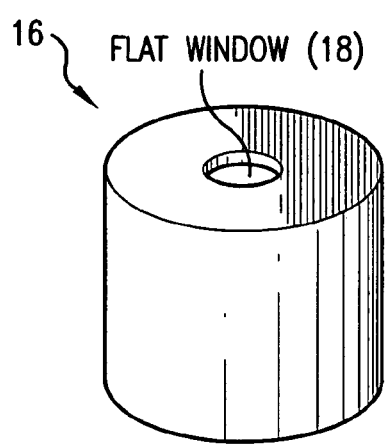

The embodiments described herein are associated with the TO-can design. Therefore, the discussion provided herein is focused primarily on the TO-can and similar packaging. The TO-can package shown in FIG. 2 typically consists of a TO header subassembly 14 shown in FIG. 2(a) and a sealing cap 16 with a flat window 18 shown in FIG. 2 (b).

The TO header subassembly 14 may include a TO header 20 with a number of electrical conductor pins 22 extending through the TO header 20. The TO header subassembly 14 may also include a thermo-electric cooler (TEC) 24 and a carrier module 26 that supports active and passive optical components, i.e., LD, MPD, optical lens and isolator (the lens and isolator combo). The TO header 20 may be made of a number of different materials, like cold roll steel, Kovar or other alloys. The diameter of the header should be large enough to accommodate a selected TEC 24. One example may be a TO header 24 that is 9 mm in diameter.

Figure 3:
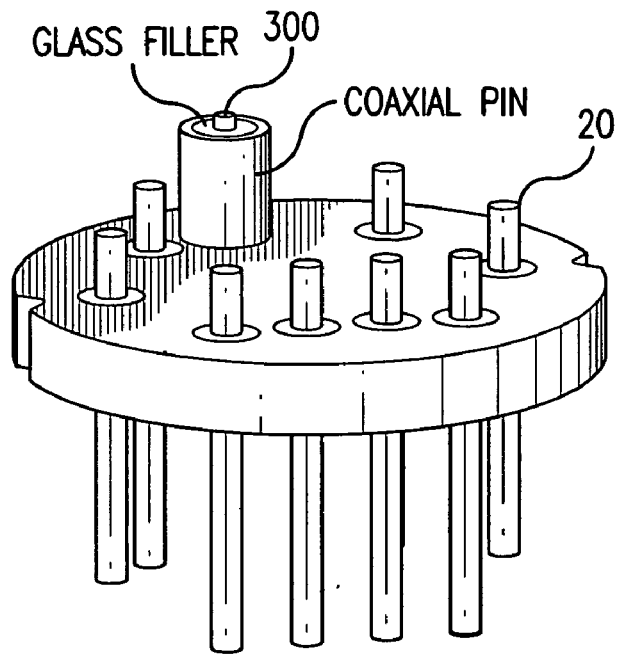
FIG. 3 shows the TO header of FIG. 1 and its pin orientation.
Figure 4:
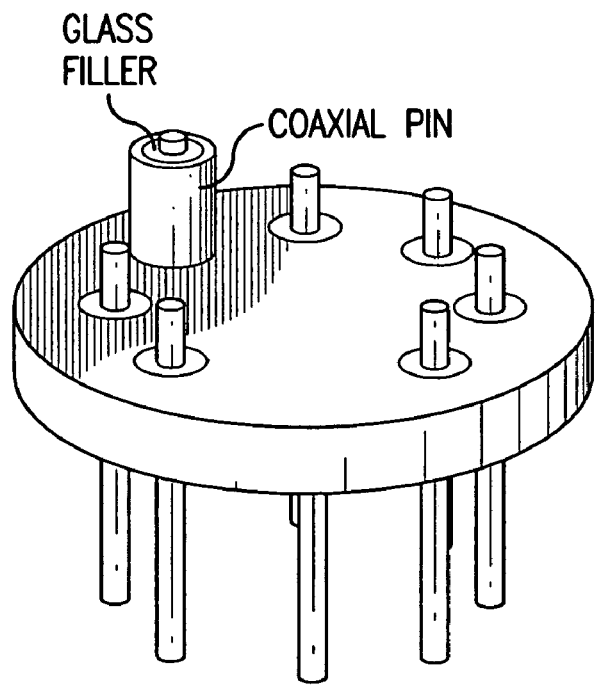
FIG. 4 shows an alternative TO header that may be used with the module of FIG. 1.

The header pins 20 may be of an inline layout or alternatively of a circular layout as shown in FIGS. 3 and 4. In order to get better RF performance at high frequency ranges, the RF pin 300 may be designed to have good impedance match. Under illustrated embodiments, a coaxial pin configuration is used as shown in FIGS. 3 and 4. The coaxial pin consists of metal tubing and a glass filler. The diameters of the tubing and pin are determined by the matching impedance and dielectric constant of the glass filler. The metal tubing is brazed on the header.

Figure 5:
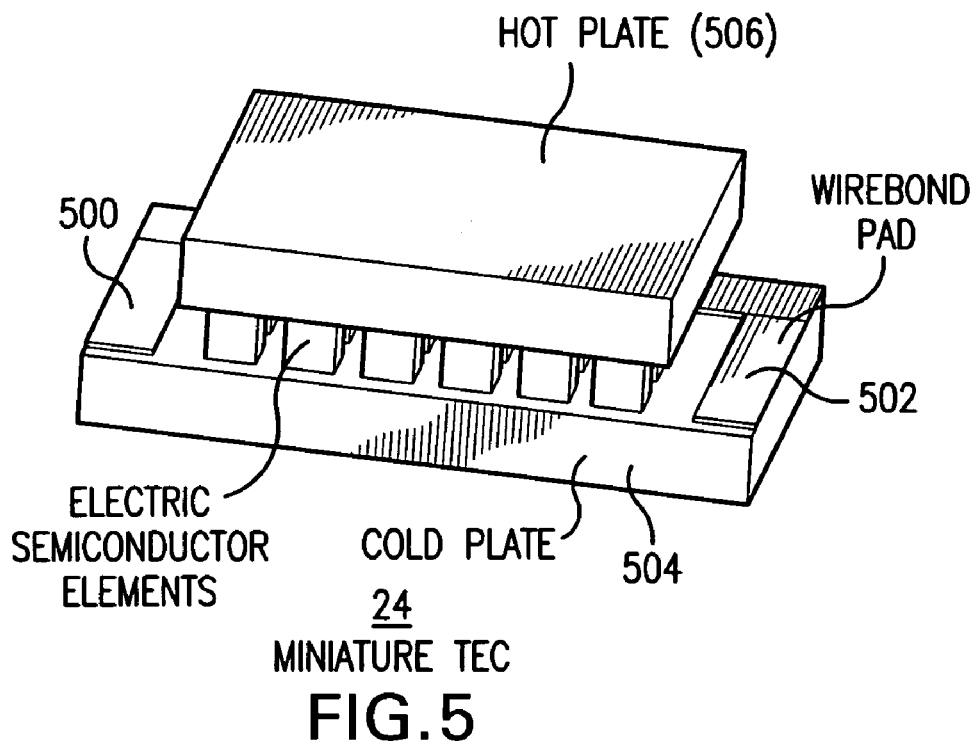
FIG. 5 shows an example of miniature TEC that may be used with the module of FIG. 1.

The TEC 24 may be any commercial available miniature cooler that consists of a hot, a cold plate and thermal electric semiconductor elements as shown in FIG. 5. The thermal electric semiconductor elements are placed in couples. The thermal capacity of the TEC should be chosen so that it has a sufficient number of thermal couples that are able to keep the cost low and yet are still adequate to dissipate both the active heat load generated by LD and the passive heat load leaked into the package from the surrounding environment. One example is the TEC with footprint of approx. 5×4 mm.

There may be two wirebond pads 500, 502 located in opposite ends of the TEC 24. Other configurations of the wirebond pads are possible. The TEC may be soldered to the center of the TO header. The wirebond pads 500, 502 may be connected to pins 22 via a pair of wirebonds 32.

Figure 7A:
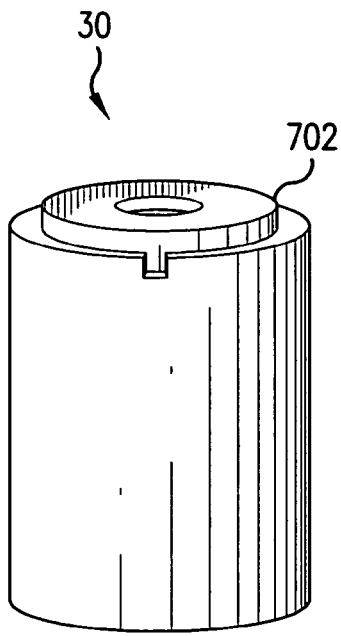
FIG. 7 (a) and (b) show the optical lens and isolator combo of FIG. 1.
Figure 7B:
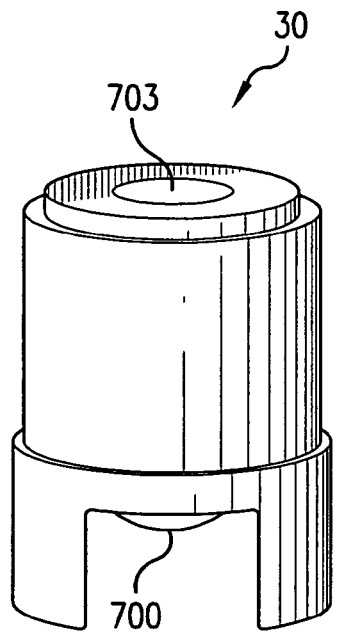
Figure 8A:
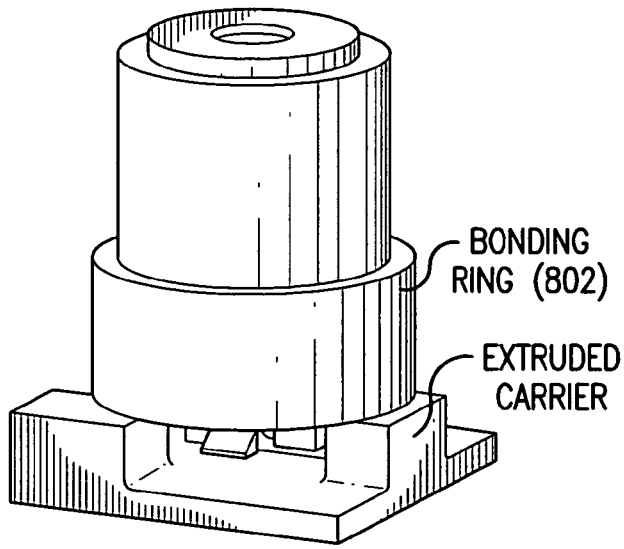
FIG. 8 (a) and (b) show an alternative carrier module with lens and isolator combo that may be used with the module of FIG. 1.

The carrier module 26 is mounted onto the cold plate 504 of the TEC and is populated with a LD 600, a MPD 604, a reflection mirror 602 and the lens and isolator combo (FIGS. 7 and 8). The LD 600 may be mounted on a LD submount 606 that is made of a material with good thermal conductivity. One example is aluminum nitride (AlN). There may be several Au metalized pads on the LD submount (not shown in the figure) to allow soldering of the leads of the LD and other possible components to an intermediate connection point and then on to the leads 22. The LD 600 may be an edge emitting laser and may be soldered vertically on the submount.

Alternatively, a surface emitting laser is also suitable for this application with slight modification of the LD submount 606. The edge emitting laser emits laser light in two directions, one is in a forward direction from a front facet and the other is backward from a rear facet.

Figure 6:
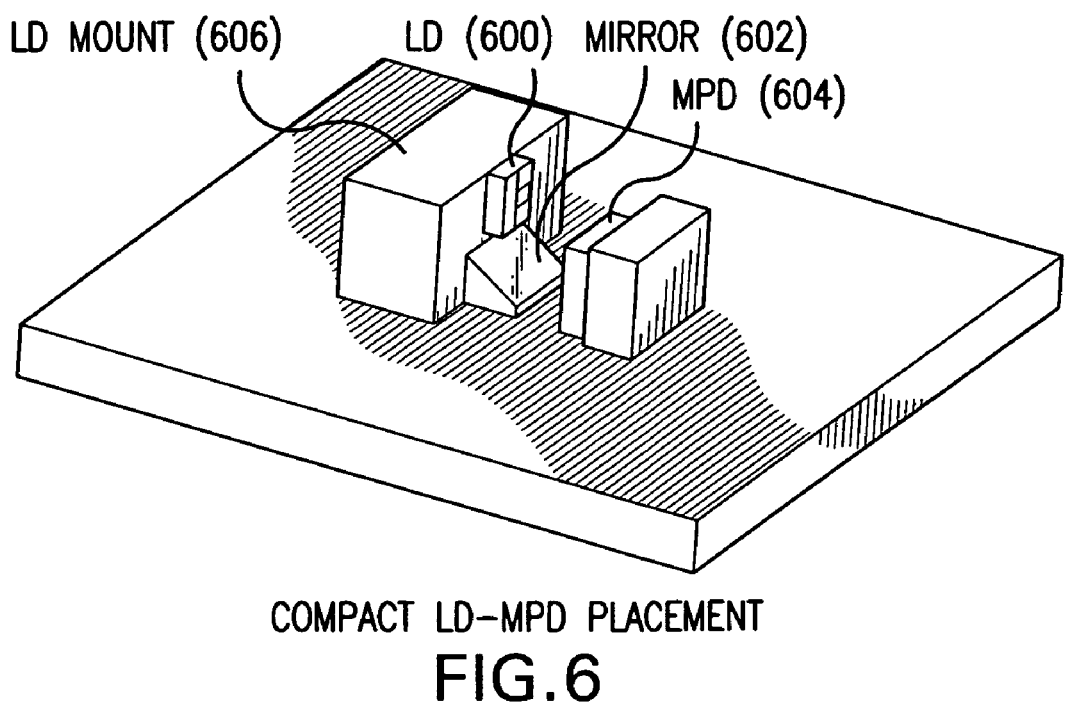
FIG. 6 shows the compact LD-MPD placement within the module of FIG. 1.

In a traditional uncooled TO laser package where the edge-emitting laser is used, the MPD is mounted beneath the LD to catch the laser light from the rear facet of the LD for purposes of monitoring laser performance. This configuration has a drawback, i.e., it raises the profile of the components on the cold plate of the TEC, resulting in poor mechanical and thermal stability. Under illustrated embodiments, a compact LD-MPD configuration is provided as shown in FIG. 6.

A wedge shaped mirror reflector 602 is used to reflect the laser light and to redirect it to the MPD 604 that is mounted in front of the LD. In this way, the profile of the components is lower significantly. The wedge shaped mirror is made of metal, ceramic or silicon with Au plated on the reflective surface. The surface quality is not critical because it is for monitoring purpose only. The angle of the wedge varies depending on the position and height of the MPD (e.g., 30–60 degrees). The MPD orientation may be slightly adjusted to avoid saturation and back reflection.

Referring now to FIGS. 7 and 8, a projection and shoulder combination 702 on an upper surface of the optical lens and isolator combo 30 may engage the flat window (aperture) 18 of the sealing cap 16. Alternatively, the flat window 18 may be comprised of an optically transparent material disposed in the upper surface of the sealing cap 16.

Where the flat window 18 is a transparent material, the optical lens and isolator combo 30 may be separated from the window by a short distance (e.g., less than 1 mm). Separation of the optical lens and isolator combo 30 allows the combo 30 to be thermally isolated from the sealing cap 16, yet still allows the optical signal to be transmitted by the combo 30 through the window 16 into the optical fiber.

The optical lens and isolator combo 30 may be fabricated by integrating an optical lens and an isolator in a housing to form a single compact component as shown in FIG. 7 (a). The optical lens 700 may be a ball lens or aspheric lens depending on optic design and coupling efficiency. The surface of the lens may have an anti-reflective (AR) coating. The optical isolator 703 may be suspended by the lens 700 in free space with the only connection being made to the carrier.

Alternatively, a supporting stand 800 can be integrated into the combo component as shown in FIG. 7 (b). The housing is made of Kovar or other appropriate metals.

Figure 8B:
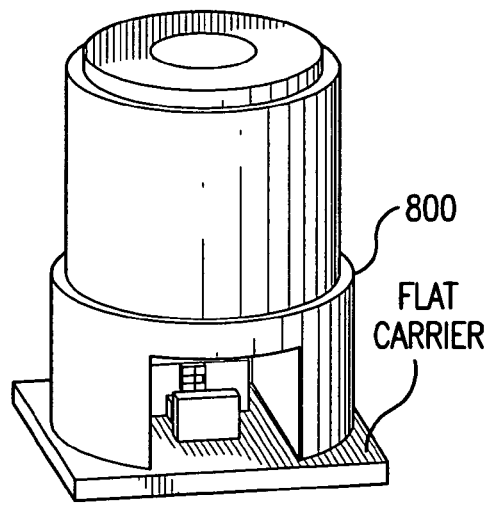

In order to get good optical performance, the lens and isolator combo 30 may be cooled by the cold plate of the TEC. Therefore, it may be mounted on the carrier module 26 along with the LD and MPD. If there is no supporting stand on the combo component, a bonding ring 802 may be needed as shown in FIG. 8 (a). The bonding ring is made of metal, like Kovar or stainless steel. However, if the supporting stand is integrated into the combo component, the combo component can be directly mounted on the carrier as shown in FIG. 8(b).

There may be two configurations of the carrier, one is extruded and the other is flat as shown in FIG. 8 (a) and (b). The carrier can be made of Kovar or stainless steel. Two methods can be employed to bond the combo component on the carrier, one is laser welding and the other is epoxy bonding. The placement of the lens-isolator component should be done using either active or passive alignment depending on the manufacturing process and requirement of coupling efficiency.

The novel features and characteristics of the invention are set forth in the appended claims. The invention itself, however, as well as other features and advantages thereof, will be best understood by reference to a detailed description of a specific embodiment, when read in conjunction with the accompanying drawings.

Compared with the TO package currently reported, this coaxial package provides cooling for both active components and passive components on the cooled platform instead of active components only. The coaxial package ensures stable laser performance over a wide range of operation temperature.

The coaxial package may include a commercially available TO header and TEC, so it is more economical and flexible in key components selection.

Compared with a traditional butterfly package, the coaxial package described herein consumes much less DC power than the butterfly package, for substantially the same laser output. Typically only ½ of the DC consumed by the butterfly package is needed by the module described above. Therefore, the package reliability is increased and thermal efficiency is also increased.

The coaxial package simplifies the manufacturing processes and significantly reduces component and labor cost. Material costs are significantly reduced by ⅓ to ½.

It will be understood that each of the elements described above, or two or more together, also may find a useful application in other types of constructions differing from the types described above.

While the invention has been illustrated and described as embodied in a laser module or transceiver for an optical communications network, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention, and therefore, such adaptations should and are intended to be comprehended within the meaning and range of equivalence of the following claims.

What is claimed is:

1. An opto-electric module adapted to be coupled with an optical fiber on a first side and a plurality of electrical conductors on a second side, said opto-electric module comprising:
   a substantially planar header with a plurality of pins extending through the header, each pin of the plurality of pins extending through the header and each pin of the plurality of pins being adapted to engage a respective conductor of the plurality of conductors on a first side of the header;
   a thermo-electric cooler with a hot plate of the thermo-electric cooler disposed against a second, opposing side of the header; and
   a plurality of active and passive optical components adapted to convert between an optical signal format within the optical fiber and an electrical signal format within at least one conductor of the plurality of conductors, said plurality of active and passive optical components all being in thermal contact with a cold plate of the thermo-electric cooler and where the hot and cold plates are substantially flat and mutually parallel with the planar header.

2. The opto-electric module as in claim 1 further comprising a sealing cap that engages the header and that substantially encloses the thermo-electric cooler and plurality of active and passive components.

3. The opto-electric module as in claim 2 wherein said sealing cap further comprises a window.

4. The opto-electric module as in claim 1 wherein said thermo-electric cooler further comprises a pair of wirebond pads.

5. The opto-electric module as in claim 4 further comprising a pair of wirebonds where each wirebond of the pair of wirebonds connects the respective wirebond pad of the pair of wirebond pads of the thermo-electric cooler and a respective pin of a pair of pins of the plurality of pins.

6. The opto-electric module as in claim 1 further comprising a carrier module disposed between the cold plate of the thermo-electric cooler and the plurality of active and passive optical components.

7. The opto-electric module as in claim 6 wherein said plurality of active and passive optical components further comprise a laser diode.

8. The opto-electric module as in claim 6 wherein said laser diode further comprises a surface emitting laser that emits light from a front and rear face where said light from said front face is coupled through the window into the optical fiber.

9. The opto-electric module as in claim 8 wherein said plurality of active and passive optical components further comprise a monitor photo-diode.

10. The opto-electric module as in claim 9 wherein said plurality of active and passive optical components further comprise a wedge-shaped mirror that couples light from the rear face of the surface emitting laser into the monitor photodiode.

11. The opto-electric module as in claim 6 further comprise a optical lens and isolator combo that is disposed on the carrier module and cooled by the thermo-electric cooler.

12. The opto-electric module as in claim 11 wherein said optical lens and isolator combo further comprises a supporting stand.

13. The opto-electric module as in claim 11 wherein said optical lens and isolator combo further comprises a bonding ring that attaches the optical lens and isolator combo to the carrier module.

14. An optical transmitter for converting and coupling an information-containing electrical signal with an optical fiber comprising:
a housing including an electrical connector for mounting and coupling with an external electrical information system device and for receiving an information-containing electrical communications signal;
a substantially planar header of the housing, said header having a plurality of pins extending through the header, each pin of the plurality of pins extending through the header and each pin of the plurality of pins being adapted to engage a respective conductor of the external connector on a first side of the header;
a window adapted for coupling with an external optical fiber for transmitting an optical communications signal;
at least one electro-optical subassembly containing a plurality of active and passive components located within the housing for converting between an information-containing electrical signal and a modulated optical signal corresponding to the electrical signal; and
a thermo-electric cooler coupled between the planar header of the housing and electro-optical subassembly to cool both the active and passive components of the subassembly, said thermo-electric cooler having a hot plate disposed against a second, opposing side of the header and a cold plate disposed against the electro-optical subassembly and where the hot and cold plates are mutually parallel with the planar header.

15. The optical transmitter as in claim 14 wherein the housing further comprises a sealing cap that engages the header and that substantially encloses the thermo-electric cooler and plurality of active and passive components.

16. The optical transmitter as in claim 15 wherein said sealing cap further comprises a window.

17. The opto-electric module as in claim 14 wherein said thermo-electric cooler further comprises a pair of wirebond pads.

18. The opto-electric module as in claim 17 further comprising a pair of wirebonds where each wirebond of the pair of wirebonds connects the respective wirebond pad of the pair wirebond pads of the thermo-electric cooler and a respective pin of a pair of pins of the plurality of pins.

19. An opto-electric module coupled with an optical fiber on a first side and a plurality of electrical conductors on a second side, said opto-electric module comprising:
a substantially planar header with a plurality of pins extending through the header, each pin of the plurality of pins extending through the header and each pin of the plurality of pins being adapted to engage a respective conductor of the plurality of conductors on a first side of the header;
a thermo-electric cooler with a first side of the thermo-electric cooler disposed on a second side of the header and where the first side and a second side of the thermo-electric cooler are substantially flat and mutually parallel with the header;
a carrier module with a first side of the carrier module disposed on the second side of the thermo-electric cooler;
a plurality of active and passive optical components disposed on a second side of the carrier module; and
a lens isolator combination that couples the optical signal with the optical fiber disposed on the second side of the carrier module.

* * * * *